(12) United States Patent
Mizukane et al.

(10) Patent No.: US 8,144,524 B2
(45) Date of Patent: Mar. 27, 2012

(54) SEMICONDUCTOR DEVICE AND SEMICONDUCTOR PACKAGE INCLUDING THE SAME

(75) Inventors: Yoshio Mizukane, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/923,254

(22) Filed: Sep. 10, 2010

(65) Prior Publication Data

US 2011/0063925 A1 Mar. 17, 2011

(30) Foreign Application Priority Data

Sep. 11, 2009 (JP) .................................. 2009-210890

(51) Int. Cl.
*G11C 7/00* (2006.01)
(52) U.S. Cl. .................... 365/189.05; 365/226; 365/193
(58) Field of Classification Search ............. 365/189.05, 365/226, 193
See application file for complete search history.

(56) References Cited

U.S. PATENT DOCUMENTS

| | | | | |
|---|---|---|---|---|
| 6,160,731 A * | 12/2000 | Choi | ................................ | 365/63 |
| 7,391,113 B2 | 6/2008 | Isa et al. | | |
| 7,518,898 B2 * | 4/2009 | Bae et al. | ......................... | 365/72 |
| 7,538,431 B2 | 5/2009 | Isa et al. | | |
| 2004/0145042 A1 * | 7/2004 | Morita et al. | .................. | 257/692 |

FOREIGN PATENT DOCUMENTS

JP  2006-278805  10/2006

* cited by examiner

*Primary Examiner* — Connie Yoha
(74) *Attorney, Agent, or Firm* — McGinn IP Law Group PLLC

(57) ABSTRACT

To include a plurality of pad groups each including a first data I/O pad, a first power supply pad, a second data I/O pad, and a second power supply pad arranged in order in an X direction. The first data I/O pad is connected to a first data I/O buffer, and the second data I/O pad is connected to a second data I/O buffer. The first power supply pad supplies a first power supply potential to the first and second data I/O buffers, and the second power supply pad supplies a second power supply potential to the first and second data I/O buffers. The first data I/O pad included in each of the pad groups is adjacent to the second power supply pad included in other pad group or any one of a plurality of power supply pads not included in any one of the pad groups.

17 Claims, 9 Drawing Sheets

SEMICONDUCTOR DEVICE AND SEMICONDUCTOR PACKAGE INCLUDING THE SAME

BACKGROUND OF THE INVENTION

1. Field of the Invention

The present invention relates to a semiconductor device and a semiconductor package including the semiconductor device, and more particularly relates to a semiconductor device including a plurality of data input/output (I/O) pads and a semiconductor package including the semiconductor device.

2. Description of Related Art

In a semiconductor device, such as a DRAM (Dynamic Random Access Memory), the number of pads is increasing with sophistication of its functionalities. For example, as the number of data bits that can be input or output at a time increases, the number of data I/O pads needs to be increased, which results in an increase of the total number of pads.

However, as opposed to the size of a transistor and a wiring pitch, which are downscaled year by year, pads are not so downsized. One of the methods for downsizing is to arrange a plurality of pads in two lines instead of arranging them in one line (see Japanese Patent Application Laid-open No. 2006-278805).

However, in a semiconductor device described in Japanese Patent Application Laid-open No. 2006-278805, there exists an area in which two data I/O pads (DQ) are arranged adjacent to each other. By arranging the data I/O pads adjacent to each other, two data wirings are arranged extending close to each other on a package substrate on which a semiconductor device is mounted, and this may cause a coupling noise in the area. To prevent the coupling noise, it is desired to make a shield by arranging a power supply pad on both sides of each of the data I/O pads.

Meanwhile, a data I/O buffer that drives a data I/O pad is likely to generate a power supply noise. Accordingly, the data I/O buffer often employs an independent power supply that is different from power supplies for other peripheral circuits. In addition, because the data I/O buffer has large instantaneous power consumption, an output power supply pad (VDDQ or VSSQ) is assigned to each of one or more data I/O buffers.

In this case, as the output power supply pads (VDDQ and VSSQ) are arranged both sides of the one or more data I/O buffers (DQ) and these are arranged as a unit in a repeated manner, it becomes possible to prevent the coupling noise. However, with this method, the number of necessary power supply pads (VDDQ and VSSQ) excessively increases as the number of data I/O pads (DQ) increases.

SUMMARY

In one embodiment of the present invention, there is provided a semiconductor device that includes a plurality of pad groups each including a first data input/output (I/O) pad, a first power supply pad, a second data I/O pad, and a second power supply pad arranged in order in one direction. The first data I/O pad is connected to a first data I/O buffer. The second data I/O pad is connected to a second data I/O buffer. The first power supply pad supplies a first power supply potential to the first and second data I/O buffers. The second power supply pad supplies a second power supply potential to the first and second data I/O buffers. The first data I/O pad included in at least one of the pad groups is adjacent to any one of a plurality of power supply pads not included in any one of the pad groups.

In the present invention, pads are "adjacent" means that there exists no other pad between two pads to be focused on, and does not particularly mean that the two pads are arranged physically close to each other. Therefore, a peripheral circuit area can exist between two adjacent pads. This is because the coupling noise on the package substrate to which the semiconductor device is mounted matters in the present invention, and even if two adjacent pads are not arranged close to each other, they are respectively connected to wirings that extend close to each other on the package substrate.

According to the present invention, a pad group constituted by four pads including two data I/O pads and two power supply pads as a unit is arranged in a repeated manner, and a first data I/O pad located at an edge in each pad group is placed close to a power supply pad that does not belong to the corresponding pad group. Therefore, it becomes possible to reduce the number of necessary power supply pads. Accordingly, even when there are a large number of data I/O pads, it becomes possible to suppress an increase of the total number of pads while preventing the coupling noise on the package substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
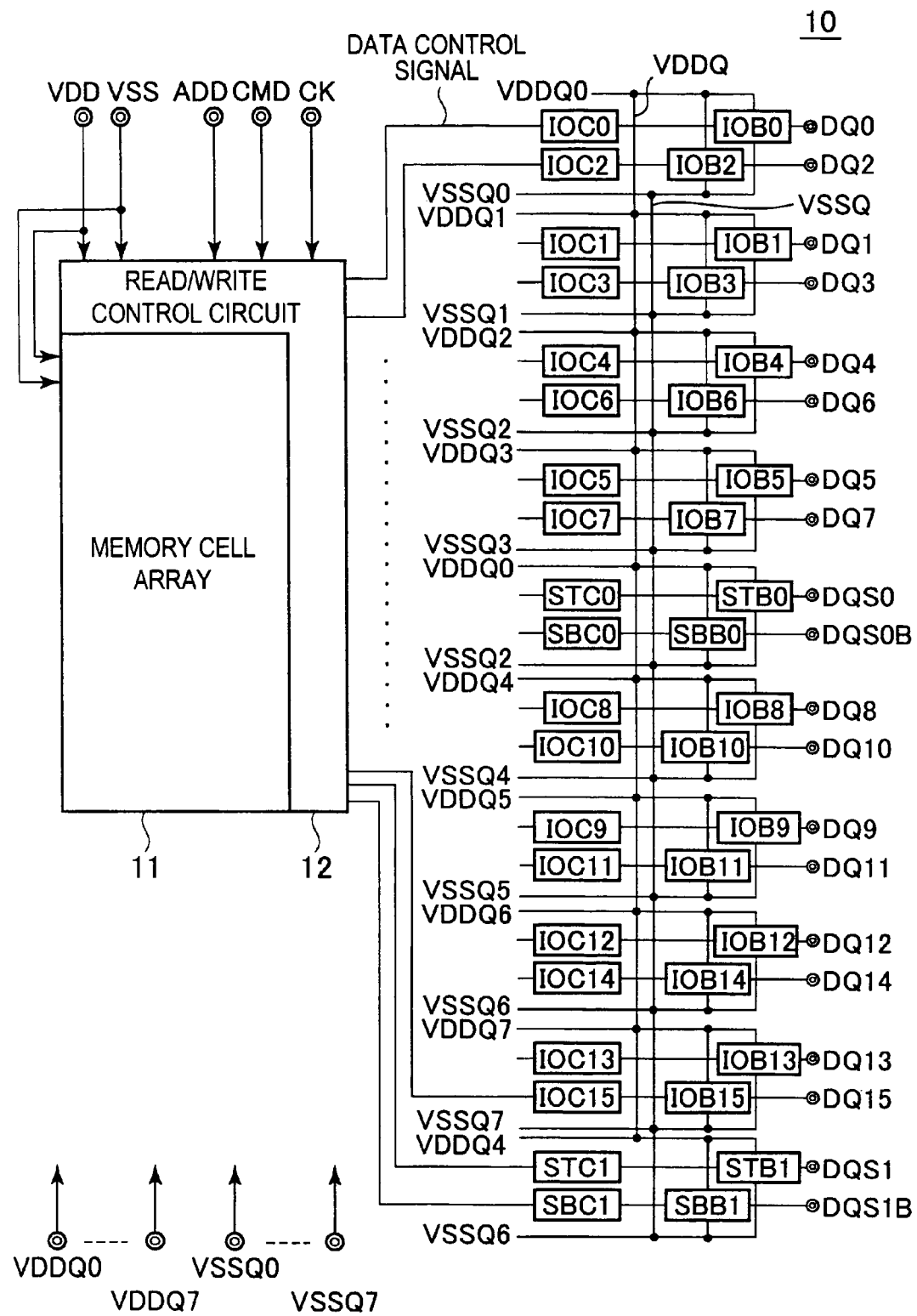
FIG. 1 is a block diagram showing a configuration of a semiconductor device according to a preferred embodiment of the present invention.

FIG. 1 is a block diagram showing a configuration of a semiconductor device 10 according to a preferred embodiment of the present invention.

As shown in FIG. 1, the semiconductor device 10 according to the present embodiment includes a memory cell array 11 and a read/write control circuit (a peripheral circuit) 12 that performs a read operation or a write operation for the memory cell array 11. The memory cell array 11 and the read/write control circuit 12 are supplied with their operation voltages from power supply pads VDD and VSS. An address signal, a command signal, and a clock signal are supplied to the read/write control circuit 12 via an address pad ADD, a command pad CMD, and a clock pad CK, respectively. The read/write control circuit 12 performs a read/write operation based on these signals.

The semiconductor device 10 further includes sixteen data I/O pads DQ0 to DQ15. The data I/O pads DQ0 to DQ15 are connected to corresponding data I/O buffers IOB0 to IOB15, respectively. The data I/O buffers IOB0 to IOB15 are connected to the read/write control circuit 12 via corresponding I/O control circuits IOC0 to IOC15, respectively. The I/O control circuits IOC0 to IOC15 specify an output timing of data and an impedance of corresponding one of the data I/O buffers IOB0 to IOB15 in response to a control signal supplied from the read/write control circuit 12.

The semiconductor device 10 further includes output power supply pads VDDQ0 to VDDQ7 and VSSQ0 to VSSQ7. These output power supply pads are provided separately from the power supply pads VDD and VSS and used for supplying powers to the data I/O buffers IOB0 to IOB15. This is because the data I/O buffers are prone to generate the power supply noise so that the power supplies for the data I/O buffers IOB0 to IOB15 need to be provided separately from power supplies for the other peripheral circuits. In the present embodiment, a pair of power supply pads VDDQi and VSSQi (i=0 to 7) is assigned to two data I/O buffers. For example, a pair of power supply pads VDDQ0 and VSSQ0 is assigned to two data I/O buffers IOB0 and IOB2, a pair of power supply pads VDDQ1 and VSSQ1 is assigned to two data I/O buffers IOB1 and IOB3. The expression that the pair of power supply pads VDDQi and VSSQi (i=0 to 7) is assigned to the two data I/O buffers means that the pair of power supply pads VDDQi and VSSQi (i=0 to 7) mainly supplies powers to the two data I/O buffers to which the power supply pads are assigned, which is not limited to a system in which the pair of power supply pads VDDQi and VSSQi (i=0 to 7) are exclusively connected to the two data I/O buffers to which the power supply pads are assigned. For example, as shown in FIG. 1, a high-side power supply wiring VDDQ for supplying a high-side potential VDD to a corresponding data I/O buffer from each of the high-side power supply pads VDDQi is connected in common in a chip in the present embodiment. In this manner, by connecting the high-side power supply wiring VDDQ in common, it is possible to make voltages of high-side power supplies supplied to a plurality of data I/O buffers substantially the same. A low-side power supply wiring VSSQ is also connected in common, in a similar manner to the high-side power supply wiring VDDQ.

In the present embodiment, a pair of data strobe pads is assigned to eight data I/O pads. Specifically, data strobe pads DQS0 and DQS0B are assigned to the data I/O pads DQ0 to DQ7, and data strobe pads DQS1 and DQS1B are assigned to the data I/O pads DQ8 to DQ15. The data strobe pads are connected to corresponding DQS buffers STB0, SBB0, STB1, and SBB1, respectively. The DQS buffers STB0, SBB0, STB1, and SBB1 are connected to the read/write control circuit 12 via corresponding DQS control circuits STC0, SBC0, STC1, and SBC1, respectively.

In the example shown in FIG. 1, operation voltages of the DQS buffers STB0 and SBB0 are supplied from the output power supply pads VDDQ0 and VSSQ2, and operation voltages of the DQS buffers STB1 and SBB1 are supplied from the output supply pads VDDQ4 and VSSQ6. However, this is merely an example, which means that the operation voltage of the DQS buffer can be supplied from any one of the power supply pads as long as it is an output power supply pad. Alternatively, a dedicated power supply pad for the DQS buffer can be provided to supply the operation voltage therefrom.

Figure 2:
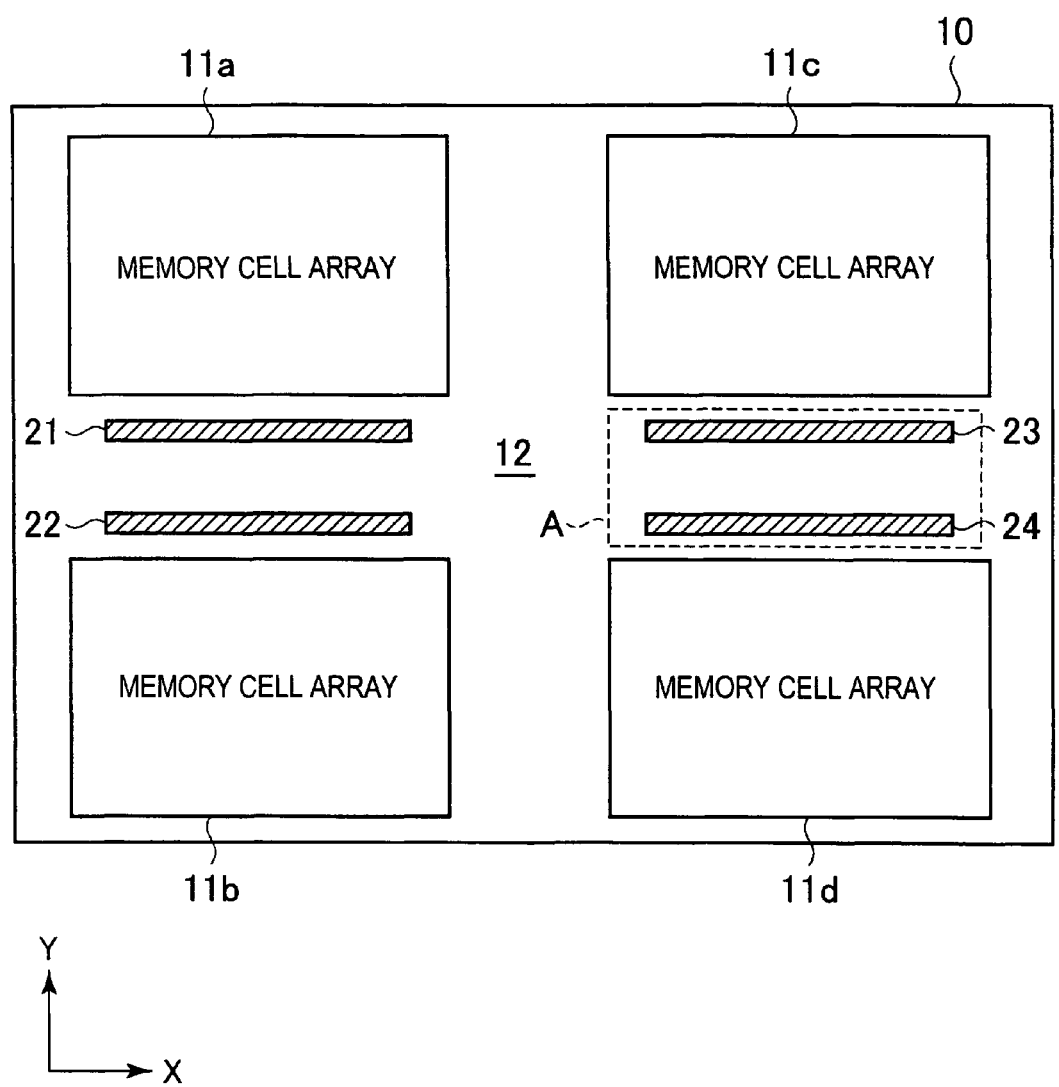
FIG. 2 is an overall view for explaining a layout of the semiconductor device according to the present embodiment.

FIG. 2 is an overall view for explaining a layout of the semiconductor device 10 according to the present embodiment.

As shown in FIG. 2, in the present embodiment, the memory cell array 11 is divided into four memory cell areas 11a to 11d, and a peripheral circuit area 12a in which the read/write control circuit 12 and the like are arranged and pad areas 21 to 24 are provided in an area sandwiched by the memory cell areas 11a to 11d.

More specifically, the memory cell area 11a and the memory cell area 11b are arranged side by side in a Y direction, and two pad areas 21 and 22 extending in an X direction are arranged between the memory cell areas 11a and 11b. Similarly, the memory cell area 11c and the memory cell area 11d are arranged side by side in the Y direction, and two pad areas 23 and 24 extending in the X direction are arranged between the memory cell areas 11c and 11d. The Y coordinates of the pad areas 21 and 23 match each other, and similarly, the Y coordinates of the pad areas 22 and 24 match each other.

Figure 3:
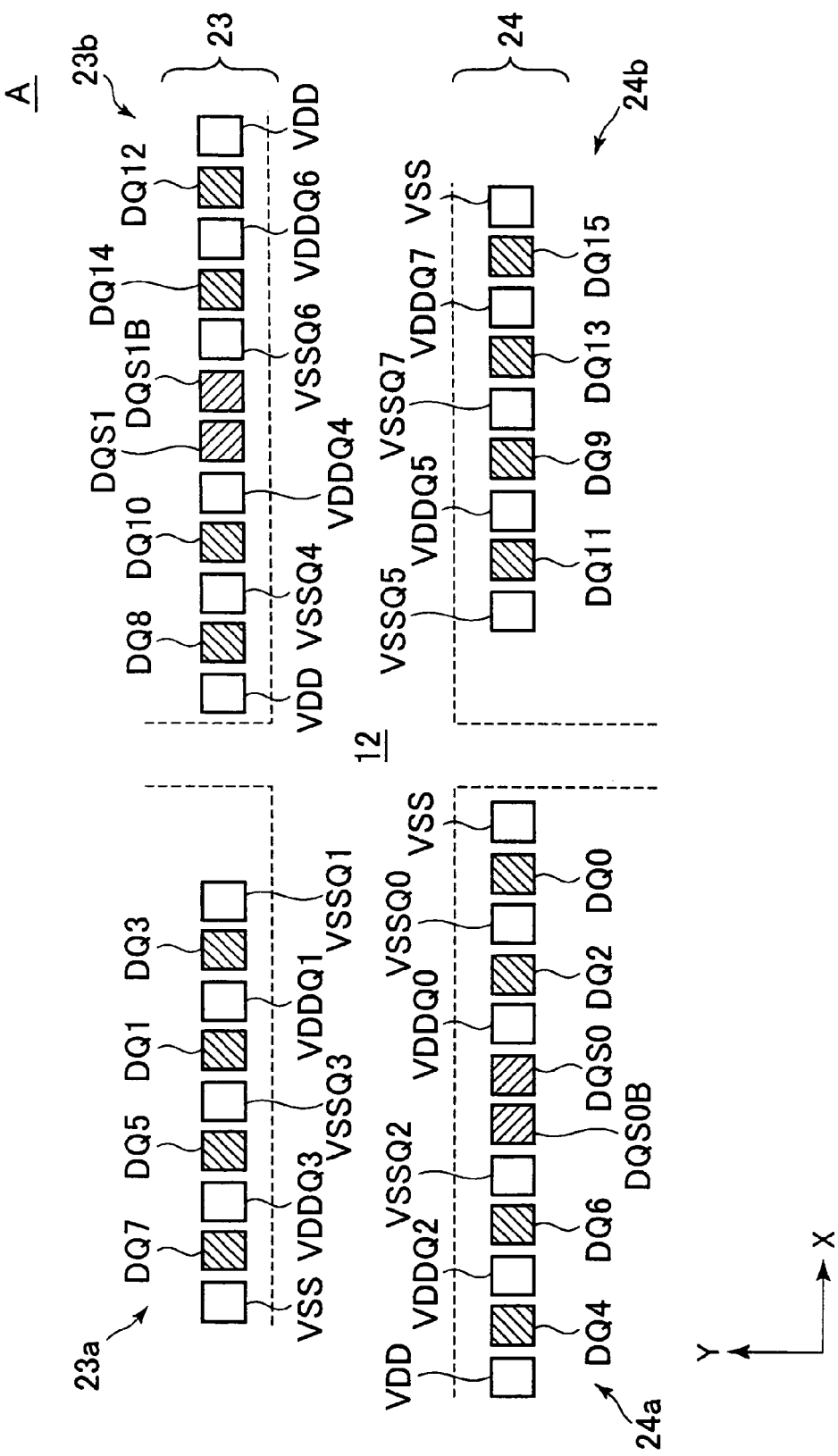
FIG. 3 is a schematic enlarged diagram of an area A shown in FIG. 2.

FIG. 3 is a schematic enlarged diagram of an area A shown in FIG. 2.

As shown in FIG. 3, both of the pad areas 23 and 24 are divided into two areas in the X direction. All spaces between pad areas 23a and 23b, between pad areas 24a and 24b, between pad areas 23a and 24a, and between pad areas 23b and 24b are the peripheral circuit area 12a, in which the read/write control circuit 12 shown in FIG. 1 and the like are formed.

In FIG. 3, a pad on which a diagonally right up hatching is marked is a data I/O pad, and a pad on which a diagonally left up hatching is marked is a data strobe pad. A pad on which no hatching is marked is a power supply pad. As is clear from FIG. 3, in the present embodiment, each of the data I/O pads DQ0 to DQ15 is sandwiched by two power supply pads. The data strobe pads DQS0 and DQS0B that make a pair are arranged adjacent to each other, and the power supply pads are arranged adjacent to each other on both sides of the pair of the data strobe pads DQS0 and DQS0B. Similarly, the data strobe pads DQS1 and DQS1B that make a pair are arranged adjacent to each other, and the power supply pads are arranged adjacent to each other on both sides of the pair of the data strobe pads DQS1 and DQS1B.

In the semiconductor device 10 according to the present embodiment, the number of I/Os, that is, the number of data bits simultaneously input or output can be switched. Specifically, in a mode in which the number of I/Os is set to 16 bits, all the data I/O pads DQ0 to DQ15 are used. In a mode in which the number of I/Os is set to 8 bits, the data I/O pads DQ0 to DQ7 are used. In this case, the data I/O pads DQ8 to DQ15 are not used. In addition, in a mode in which the number of I/Os is set to 4 bits, the data I/O pads DQ0 to DQ4 are used. In this case, the data I/O pads DQ5 to DQ15 are not used. These modes are set at a production phase, and therefore a bonding itself is not performed on the unavailable data I/O pads. However, it is also acceptable to make these modes user selectable. In this case, a bonding needs to be performed on all the data I/O pads DQ0 to DQ15.

Figure 4:
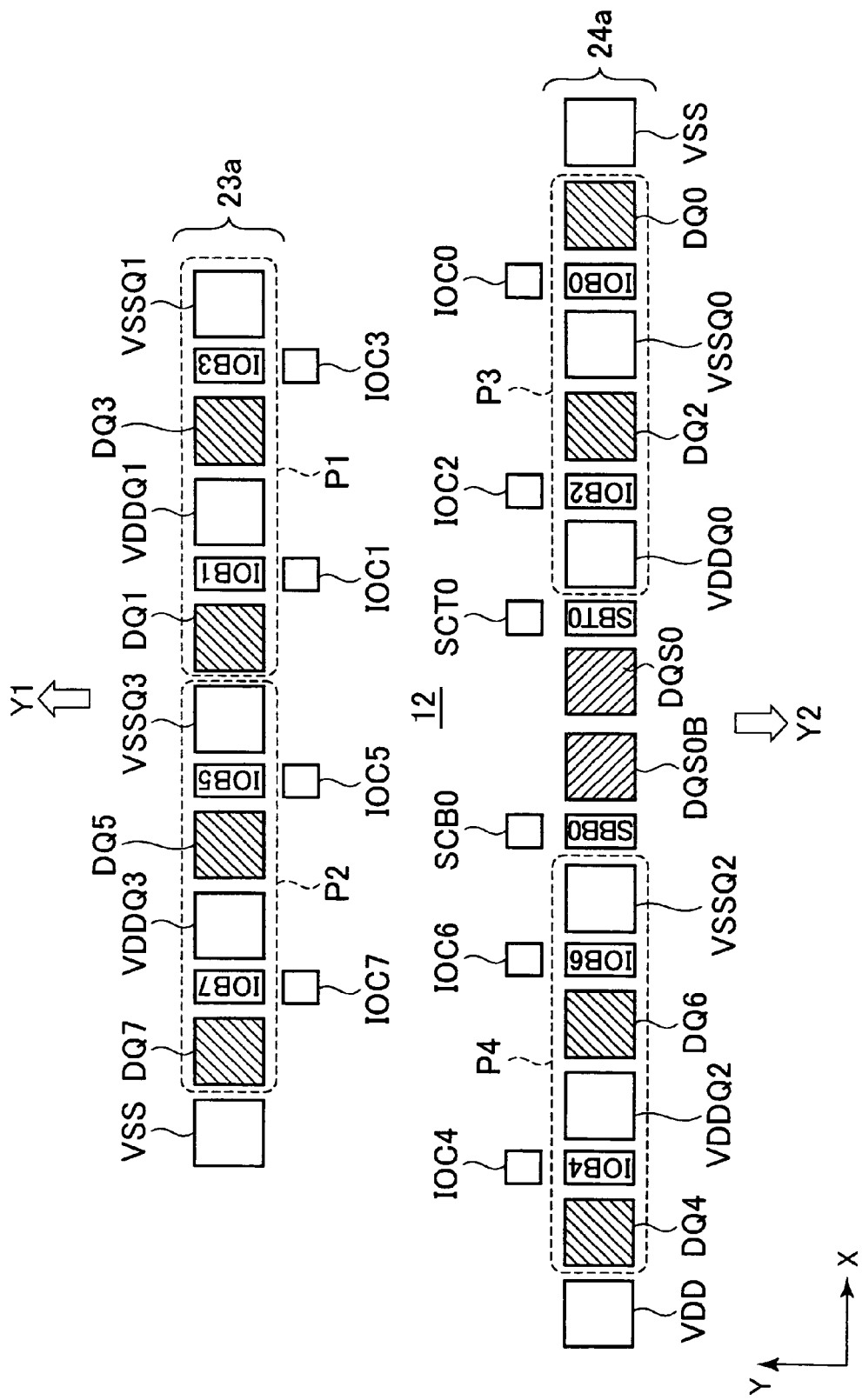
FIG. 4 is the pad areas shown in FIG. 3 in more detail.

FIG. 4 shows the pad areas 23a and 24a shown in FIG. 3 in more detail.

As shown in FIG. 4, in the pad areas 23a and 24a, pad groups P1 to P4 each including two data I/O pads and two power supply pads are included. Each of the pad groups P1 to P4 has a configuration in which the data I/O pads and the power supply pads are alternately arranged in the X direction.

The two power supply pads belonging to the same pad group supply operation voltages to two data I/O buffers which are connected to the data I/O pads belonging to the same pad group, respectively. Each of the data I/O buffers is arranged between the data I/O pad and the power supply pad belonging to the same pad group.

More specifically, the pad area 23a is constituted by nine pads including two pad groups P1 and P2 arranged adjacent to each other in the X direction and the power supply pad VSS arranged adjacent to the pad group P2.

The pad group P1 includes the data I/O pad DQ1, the power supply pad VDDQ1, the data I/O pad DQ3, and the power supply pad VSSQ1 arranged from the left to the right. With this configuration, the data I/O pad DQ3 is sandwiched by the two power supply pads VDDQ1 and VSSQ1 belonging to the pad group P1. The data I/O buffer IOB1 is arranged between the data I/O pad DQ1 and the power supply pad VDDQ1, and the data I/O buffer IOB3 is arranged between the data I/O pad DQ3 and the power supply pad VSSQ1. As shown in FIG. 1, the power supply pads VDDQ1 and VSSQ1 supply operation powers mainly to the data I/O buffers IOB1 and IOB3.

The pad group P2 includes the data I/O pad DQ7, the power supply pad VDDQ3, the data I/O pad DQ5, and the power supply pad VSSQ3 arranged from the left to the right. With this configuration, the data I/O pad DQ5 is sandwiched by the two power supply pads VDDQ3 and VSSQ3 belonging to the pad group P2. Furthermore, the data I/O pad DQ1 belonging to the pad group P1 is sandwiched by the power supply pad VDDQ1 belonging to the pad group P1 and the power supply pad VSSQ3 belonging to the pad group P2. The data I/O buffer IOB7 is arranged between the data I/O pad DQ7 and the power supply pad VDDQ3, and the data I/O buffer IOB5 is arranged between the data I/O pad DQ5 and the power supply pad VSSQ3. As shown in FIG. 1, the power supply pads VDDQ3 and VSSQ3 supply operation powers mainly to the data I/O buffers IOB5 and IOB7.

Furthermore, the power supply pad VSS is arranged adjacent to the data I/O pad DQ7 on its left. The power supply pad VSS is not a pad that supplies the operation voltage to the data I/O buffer, but being arranged at this position, the data I/O buffer DQ7 becomes sandwiched by the two power supply pads VDDQ3 and VSS.

With the above configuration, each of the data I/O pads DQ1, DQ3, DQ5, and DQ7 included in the pad area 23a is sandwiched by two power supply pads. The nine pads included in the pad area 23a are bonded in an Y1 direction shown in FIG. 4.

On the other hand, the pad area 24a is constituted by twelve pads including two pad groups P3 and P4, a pair of data strobe pads DQS0 and DQS0B sandwiched by the pad groups P3 and P4, the power supply pad VSS arranged at the right edge, and the power supply pad VDD arranged at the left edge.

The pad group P3 includes the data I/O pad DQ0, the power supply pad VDDQ0, the data I/O pad DQ2, and the power supply pad VSSQ0 arranged from the left to the right. With this configuration, the data I/O pad DQ2 is sandwiched by the two power supply pads VDDQ0 and VSSQ0 belonging to the pad group P3. The data I/O buffer IOB0 is arranged between the data I/O pad DQ0 and the power supply pad VDDQ0, and the data I/O buffer IOB2 is arranged between the data I/O pad DQ2 and the power supply pad VSSQ0. As shown in FIG. 1, the power supply pads VDDQ0 and VSSQ0 supply operation powers mainly to the data I/O buffers IOB0 and IOB2.

Furthermore, the power supply pad VSS is arranged adjacent to the data I/O pad DQ0 on its right. The power supply pad VSS is not a pad that supplies the operation voltage to the data I/O buffer, but being arranged at this position, the data I/O buffer DQ0 becomes sandwiched by the two power supply pads VDDQ0 and VSS.

The pad group P4 includes the data I/O pad DQ4, the power supply pad VDDQ2, the data I/O pad DQ6, and the power supply pad VSSQ2 arranged from the left to the right. With this configuration, the data I/O pad DQ6 is sandwiched by the two power supply pads VDDQ2 and VSSQ2 belonging to the pad group P4. The data I/O buffer IOB4 is arranged between the data I/O pad DQ4 and the power supply pad VDDQ2, and the data I/O buffer IOB6 is arranged between the data I/O pad DQ6 and the power supply pad VSSQ2. As shown in FIG. 1, the power supply pads VDDQ2 and VSSQ2 supply operation powers mainly to the data I/O buffers IOB4 and IOB6.

Furthermore, the power supply pad VDD is arranged adjacent to the data I/O pad DQ4 on its left. The power supply pad VDD is not a pad that supplies the operation voltage to the data I/O buffer, but being arranged at this position, the data I/O buffer DQ4 becomes sandwiched by the two power supply pads VDDQ2 and VDD.

With the above configuration, each of the data I/O pads DQ0, DQ2, DQ4, and DQ6 included in the pad area 24a is sandwiched by two power supply pads.

Furthermore, the data strobe pads DQS0 and DQS0B are arranged adjacent to each other, the power supply pad VDDQ0 is arranged on the right side of the data strobe pad DQS0, and the power supply pad VSSQ0 is arranged on the left side of the data strobe pad DQS0B. With this configuration, the pair of the data strobe pads DQS0 and DQS0B is shielded by the power supply pads VDDQ0 and VSSQ2. A DQS buffer SBT0 is arranged between the data strobe buffer DQS0 and the power supply pad VDDQ0, and a DQS buffer SBB0 is arranged between the data strobe pad DQS0B and the power supply pad VSSQ2.

These twelve pads included in the pad area 24a are bonded in an Y2 direction shown in FIG. 4.

The configurations of the pad areas 23a and 24a is as described above. As explained above, each of the data I/O pads DQ0 to DQ7 included in the pad areas 23a and 24a is sandwiched by two adjacent power supply pads. The thing is, because at one end of each pad group in the X direction, the power supply pad is located and at the other end, the data I/O pad is located, if the other end is arranged adjacent to a power supply pad included in other pad group or a power supply pad that is not included in any of the pad groups, each of all the data I/O pads can be sandwiched by two power supply pads. As a result, it becomes possible to prevent the coupling noise on the package substrate.

The pad areas 23b and 24b have the same configuration as those of the pad areas 23a and 24a, and thus redundant explanations thereof will be omitted.

Figure 5:
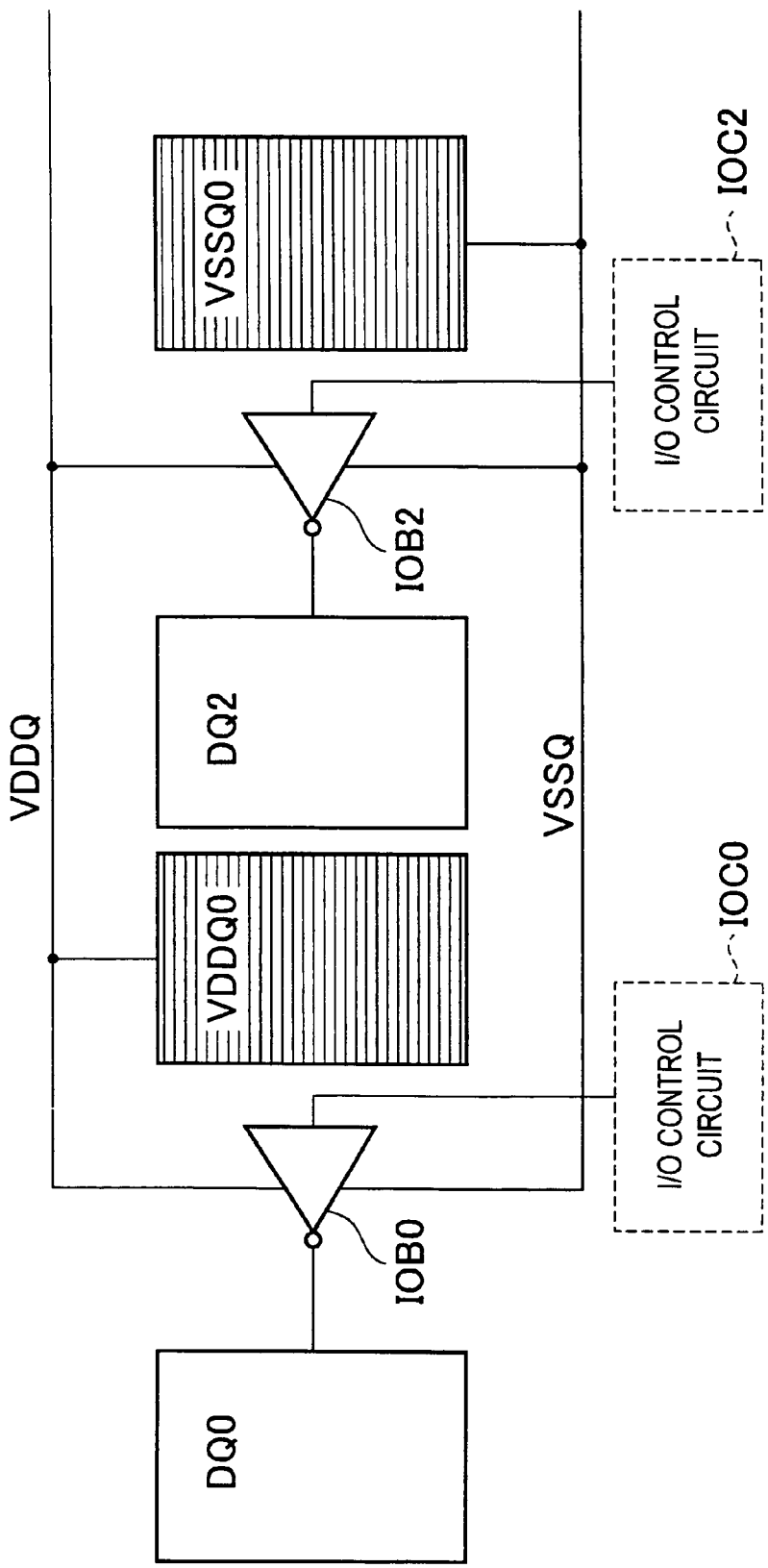
FIG. 5 is an explanatory diagram of a connection relation between four pads constituting the pad group P3.

FIG. 5 is an explanatory diagram of a connection relation between four pads constituting the pad group P3.

As shown in FIG. 5, the two data I/O pad DQ0 and DQ2 belonging to the pad group P3 are driven by the data I/O buffers IOB0 and IOB2 based on controls by the I/O control circuits IOC0 and IOC2, respectively. The data I/O buffers IOB0 and IOB2 are operated with a voltage between the high-side potential VDDQ and the low-side potential VSSQ. The high-side potential VDDQ is mainly supplied from the power supply pad VDDQ0, and the low-side potential VSSQ is mainly supplied from the power supply pad VSSQ0.

The same is true for other pad groups, and two data I/O pads belonging to the same pad row are driven with operation voltages mainly supplied from a high-side power supply pad and a low-side power supply pad belonging to the same pad row. In this manner, because the data I/O pad and its corresponding pair of power supply pads are arranged adjacent to each other, it becomes possible to shorten a distance of a power supply wiring. Although it is preferable that high-side power supply pads and low-side power supply pads belonging to different pad rows be connected to each other via a high-side power supply wiring or a low-side power supply wiring in each chip, the present invention is not limited to this configuration. For example, it is acceptable for the high-side power supply pads and the low-side power supply pads belonging to different pad rows not to be connected to each other.

Figure 6:
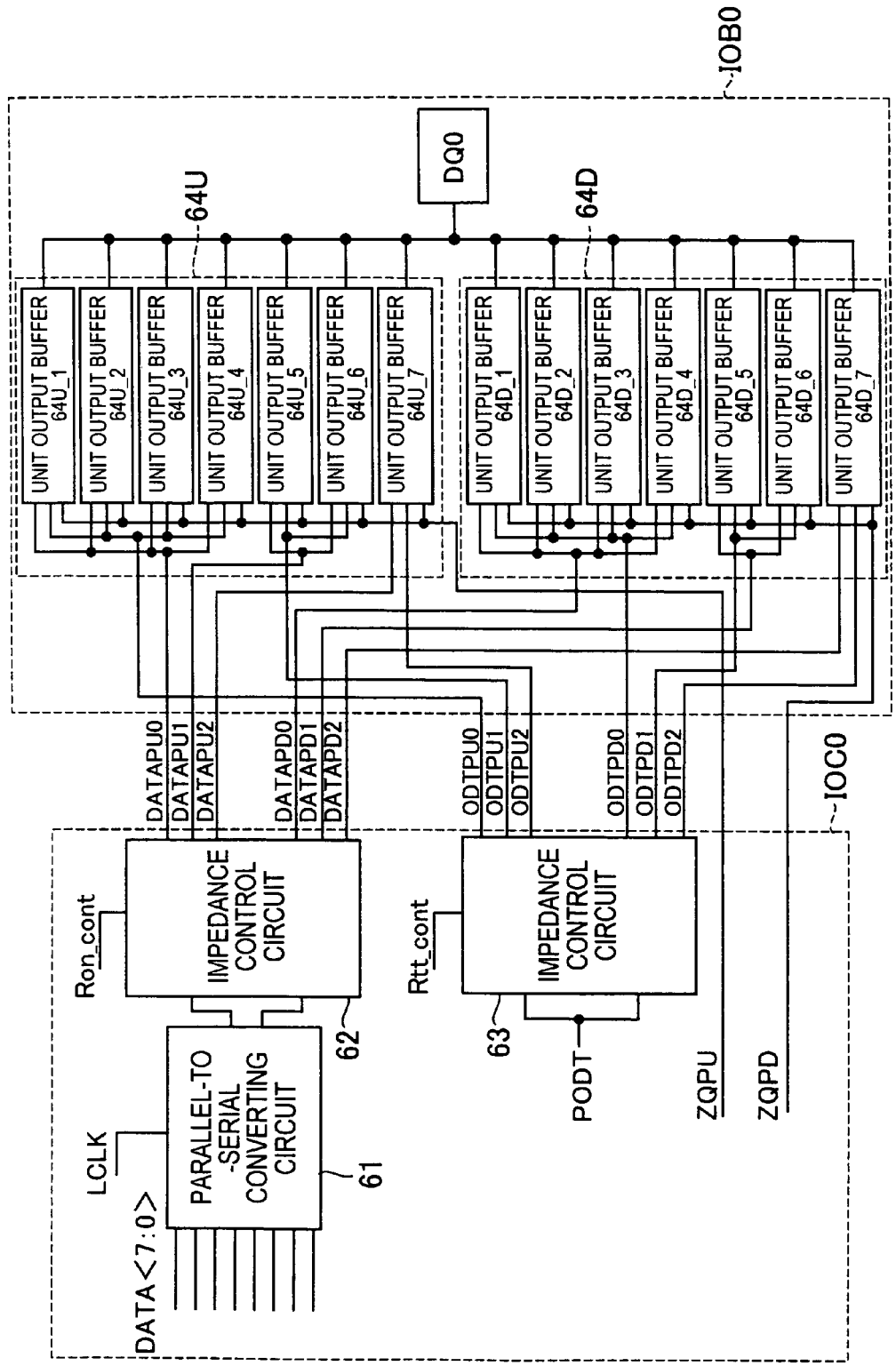
FIG. 6 is a circuit diagram of the data I/O buffer IOB0 and the I/O control circuit IOC0.

FIG. 6 is a circuit diagram of the data I/O buffer IOB0 and the I/O control circuit IOC0.

FIG. 6 shows a configuration of an output circuit for one DQ, constituted by the I/O control circuit IOC0 and the output buffer IOB0. The I/O control circuit IOC0 includes a parallel-to-serial converting circuit 61, an impedance control circuit 62, and an impedance control circuit 63. The parallel-to-serial converting circuit 61 converts parallel internal read data DATA <7:0> supplied from the read/write control circuit 12 into serial data in synchronization with an output clock LCLK supplied from the read/write control circuit 12. The impedance control circuit 62 adjusts impedances of output buffers 64U and 64D to predetermined impedances required for an output operation in response to an impedance control signal Ron_cont supplied from the read/write control circuit 12. The impedance control circuit 63 adjusts the impedances of the output buffers 64U and 64D to predetermined impedances required for a termination operation (an ODT operation) in response to an impedance control signal Rtt_cont supplied from the read/write control circuit 12. A signal PODT supplied from the read/write control circuit 12 to the impedance control circuit 63 is a signal that is activated at the ODT operation.

Furthermore, the data I/O buffer IOB0 includes the pull-up side output buffer unit 64U and the pull-down side output buffer unit 64D that are connected in series between the high-side potential VDDQ (not shown) and the low-side potential VSSQ (not shown). A connection point of the pull-up side output buffer unit 64U and the pull-down side output buffer unit 64D is connected to its corresponding data I/O pad DQ0. In addition, the pull-up side output buffer unit 64U and the pull-down side output buffer unit 64D include unit output buffers 64U1 to 64U7 and unit output buffers 64D1 to 64D_7, respectively, and the impedance of each of the unit output buffers 64U_1 to 64U_7 and 64D_1 to 64D_7 is adjusted to a predetermined impedance (for example, 240Ω) in response to impedance adjustment signals ZQPU and ZQPD supplied from the read/write control circuit 12.

Figure 7:
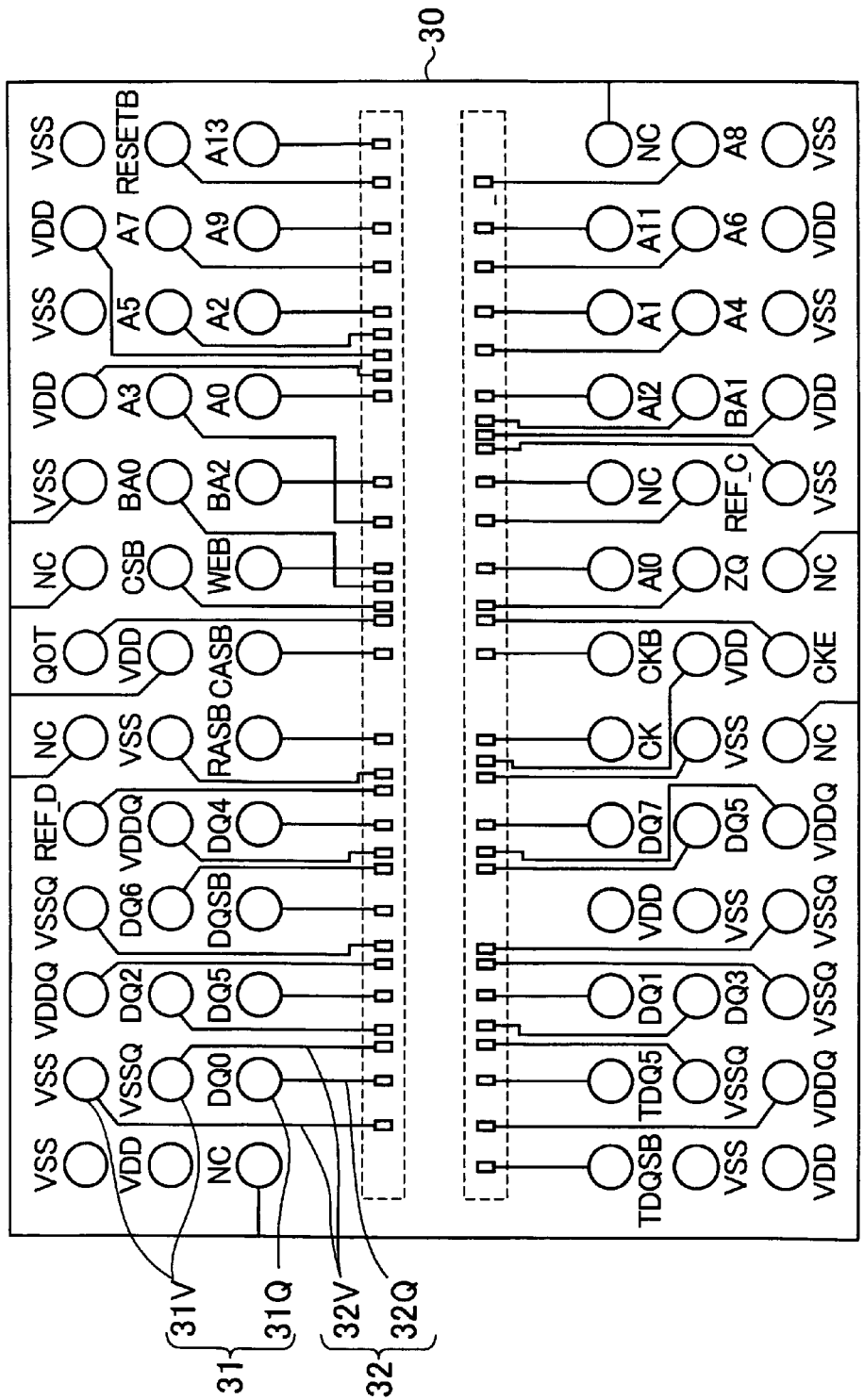
FIG. 7 is a schematic plan view showing a configuration of a package substrate on which the semiconductor device according to the present embodiment is mounted.

FIG. 7 is a schematic plan view showing a configuration of a package substrate 30 on which the semiconductor device 10 according to the present embodiment is mounted.

As shown in FIG. 7, the package substrate 30 includes a plurality of external terminals (balls) 31 and a plurality of wirings 32 that respectively connects pads of the semiconductor device 10 and the external terminals 31 corresponding thereto. The external terminals 31 include power supply terminals 31V to which the power supply potentials are supplied and data terminals 31Q for performing input and output of data. Similarly, the wirings 32 include power supply wirings 32V to which the power supply potentials are supplied and data wirings 32Q for performing input and output of data.

In the present embodiment, the wirings 32 of the package substrate 30 are provided in a single-layered structure. Therefore, an arrangement order of the pads on the semiconductor device 10 and an arrange order of the wirings 32 on the package substrate 30 show one-to-one correspondence relation. In the present embodiment, because each of the data I/O pads DQ0 to DQ15 is sandwiched by two adjacent power supply pads, each of the data wirings 32Q on the package substrate 30 is provided along an area that is sandwiched by two adjacent power supply wirings 32V. With this configuration, the coupling noise between the data wirings 32Q on the package substrate 30 is prevented, which makes it possible to enhance the signal quality.

Particularly, because the downscaling of the chip size and the increase of the number of pads are simultaneously progressed in recent years, the wirings 32 that are provided on the package substrate 30 become narrower and longer. As a result, the coupling noise between adjacent wirings becomes even more prominent. However, according to the present embodiment, because each of the data wirings 32Q that are provided on the package substrate 30 is always sandwiched by the power supply wirings 32V, even with the long and narrow data wirings 32Q, it is possible to transmit data with no degradation of the signal quality.

Figure 9:
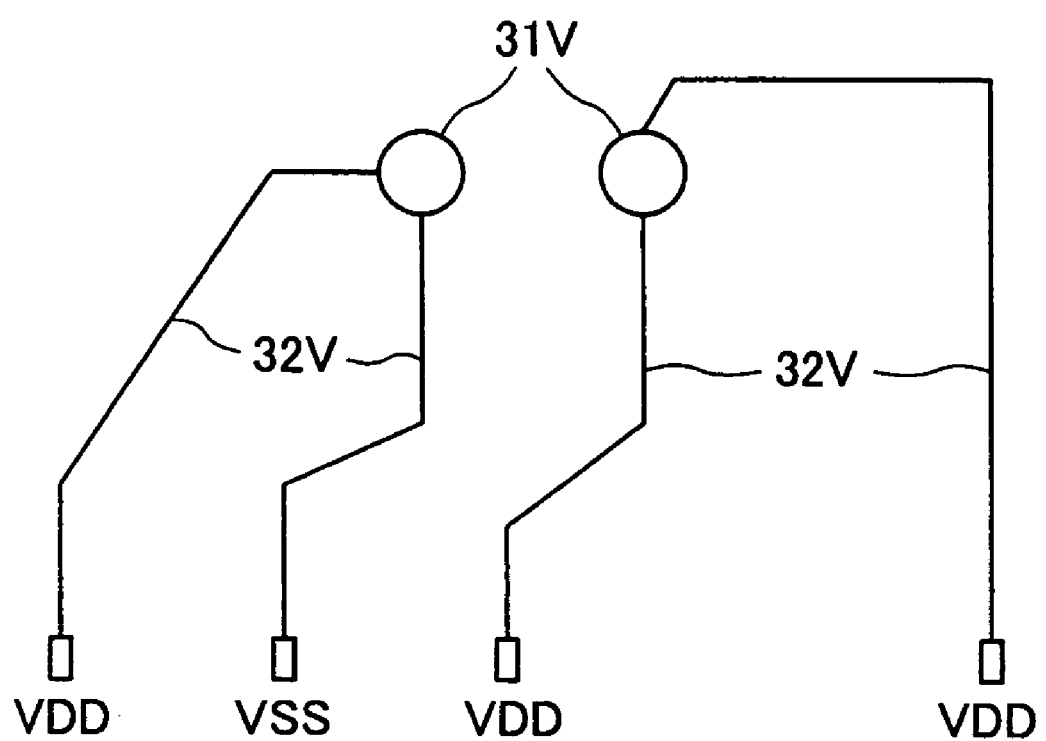
FIG. 9 shows an example that one power supply terminal 31V is connected to two power supply pads via two power supply wirings 32V.

As for the power supply terminals 31V on the package substrate 30, it is not necessary to have one-to-one correspondence with the power supply pads of the semiconductor device 10, but one power supply terminal 31V can be connected to two or more power supply pads via two or more power supply wirings 32V as shown in FIG. 9. With this arrangement, because the number of power supply wirings on the package substrate 30 is increased, the shield effect can be enhanced.

It is apparent that the present invention is not limited to the above embodiments, but may be modified and changed without departing from the scope and spirit of the invention.

Figure 8:
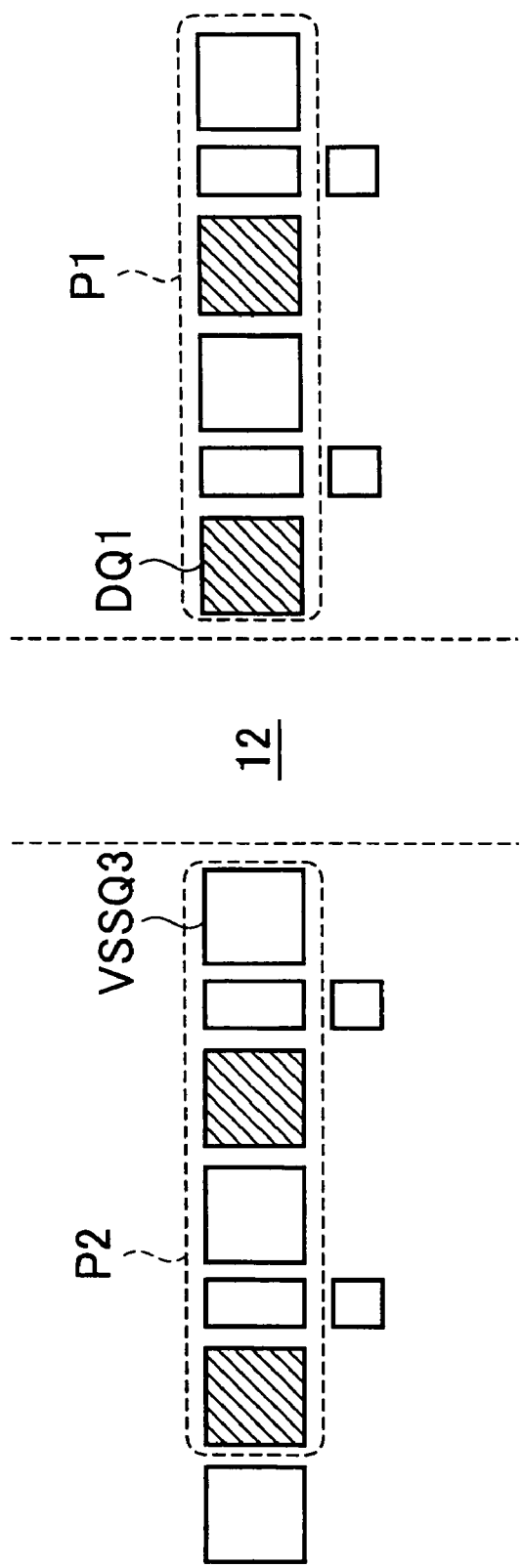
FIG. 8 is an explanatory diagram showing configuration in which a peripheral circuit is arranged between pad groups P1 and P2.

For example, although adjacent pads are arranged physically close to each other in the present embodiment, it is not essential to locate the adjacent pads close to each other in the present invention, and as long as other pads do not exist between the adjacent pads, a circuit area such as a peripheral circuit can exist between them. For example, as the example shown in FIG. 8, even if the peripheral circuit area 12a is provided between the pad group P1 and the pad group P2 such that the data I/O pad DQ1 and the power supply pad VSSQ3 are physically separated from each other, they are still being "adjacent" to each other, and the coupling noise on the package substrate is reduced.

Further, while the pad areas 21 to 24 extending in the X direction are divided into two rows in the present embodiment, the number of pad rows is not particularly limited in the present invention, and it can be one row or three or more rows. In addition, even when a plurality of pad rows are provided, it is not necessary to match the extending directions of the pad rows, so that some pad rows can extend in the X direction while the others extend in the Y direction.

Furthermore, although a pair of the data strobe pads DQS0 and DQS0B are arranged between the pad group P3 and the pad group P4 in the present embodiment, the pair of pads that is sandwiched by power supply pads each of which belongs to two pad groups respectively is not necessarily to be data strobe pads, but can be other differential signal pads to which other differential signals are supplied.

What is claimed is:

1. A semiconductor device comprising:
   a plurality of pads comprising a plurality of sets of pads and a first power supply pad which is free from the sets of pads, each of the sets of pads including first and second DQ pads and second and third power supply pads, the first DQ pad in each of the sets of pads being sandwiched between the second and third power supply pads in each of the sets of pads, the second DQ pad in each of the sets of pads being disposed on opposite side to the first DQ pad in each of the sets of pads with respect to the second power supply pad in each of the sets of pads, wherein the second DQ pad in first one of the sets of pads is sandwiched between the second power supply pad in the first one of the sets of pads and the first power supply pad without an intervention of any one of remaining ones of the pads between the second DQ pad in the first one of the sets of pads and the first power supply pad.

2. The device as claimed in claim 1, wherein the first and second DQ pads and second and third power supply pads in each of the sets of pads are arranged in line.

3. The device as claimed in claim 2, wherein the second DQ pad of second one of the sets of pads is sandwiched between the second power supply pad in the second one of the sets of pads and the third power supply pad of the first one of sets of pads without an intervention of anyone of remaining ones of the pads between the second DQ pad in the second one of the sets of pads and the third power supply pad of the first one of sets of pads.

4. The device as claimed in claim 3, wherein the pads further comprises first and second differential signal pads sandwiching between the third power supply pad of third one of the sets of pad and the third power supply pad of fourth one of the sets of pads.

5. The device as claimed in claim 4, wherein the first differential signal pad arranged adjacently to the third power supply pad of third one of the sets of pads without an intervention of any one of remaining ones of the pads and the second differential signal pad arranged adjacently to the third power supply pad of fourth one of the sets of pads without an intervention of any one of remaining ones of the pads.

6. The device as claimed in claim 4, wherein the first and second differential signal pads are a first data strobe pad and a second data strobe pad, respectively.

7. The device as claimed in claim 4, wherein the first one of the sets of pads and the second one of the sets of pads are arranged in a first line along a first direction and the third one of the sets of pads and the fourth one of the sets of pads are arranged in a second line along the first direction, and the first line and the second line are arranged in a second direction that is substantially perpendicular to the first direction.

8. The device as claimed in claim 1, further comprising
a memory cell array,
a control circuit unit that controls a read operation and a write operation for the memory cell array, and
wherein the first power supply pad supplies a first DC voltage to at least one of the memory cell array and the control circuit.

9. The device as claimed in claim 1, further comprising a plurality of first buffer circuits and a plurality of second buffer circuits, and wherein the first DQ pad in each of the sets of pads is electrically coupled to an associated one of the first buffer circuits, the second DQ pad in each of the sets of pads is electrically coupled to an associated one of the second buffer circuits, the second power supply pad in each of the sets of pads is electrically coupled in common to an associated one of the first buffer circuits and an associated one of the second buffer circuits, and the third power supply pad in each of the sets of pads is electrically coupled in common to an associated one of the first buffer circuits and an associated one of the second buffer circuits.

10. The device as claimed in claim 9, further comprising
a memory cell array,
a control circuit unit that controls a read operation and a write operation for the memory cell array, and
wherein the first power supply pad supplies a first DC voltage to at least one of the memory cell array and the control circuit, the second power supply pad in each of the sets of pads supplies a second DC voltage in common to the associated one of the first buffer circuits and the associated one of the second buffer circuits, and the third power supply pad in each of the sets of pads supplies a third DC voltage in common to the associated one of the first buffer circuits and the associated one of the second buffer circuits.

11. A semiconductor device comprising:
a memory cell array;
a control circuit unit that controls a read operation and a write operation for the memory cell array;
a first power supply pad that supplies an externally supplied first DC voltage to at least one of the memory cell array and the control circuit unit; and
a first pad group including two first data I/O pads, a second power supply pad that commonly supplies an externally supplied second DC voltage to two first data I/O buffers connected respectively to the two first data I/O pads, and a third power supply pad that commonly supplies an externally supplied third DC voltage to the two first data I/O buffers, the two first data I/O pads and the first to third power supply pads being arranged in a same row in one direction, wherein
the two first data I/O pads, the second power supply pad, and the third power supply pad included in the first pad group are arranged in order of one of the two first data I/O pads, the second power supply pad, other of the two first data I/O pads, and the third power supply pad viewed from the first power supply pad.

12. The semiconductor device as claimed in claim 11, further comprising a plurality of signal pads that supply externally supplied predetermined signals to the control circuit unit, wherein
the first pad group is arranged without sandwiching the signal pads with the first power supply pads.

13. The semiconductor device as claimed in claim 11, further comprising a second pad group including two second data I/O pads, a fourth power supply pad that commonly supplies the externally supplied second DC voltage to two second data I/O buffers connected respectively to the two second data I/O pads, and a fifth power supply pad that commonly supplies the externally supplied third DC voltage to the two second data I/O buffers, wherein
the second pad group is arranged to sandwich the first pad group with the first power supply pad, and the two second data I/O pads, the fourth power supply pad, and the fifth power supply pad included in the second pad group are arranged in order of one of the two second data I/O pads, the fourth power supply pad, other of the two second data I/O pads, and the fifth power supply pad viewed from the first pad group.

14. The semiconductor device as claimed in claim 11, further comprising:
a fourth power supply pad that supplies an externally supplied fourth DC voltage to at least one of the memory cell array and the control circuit unit; and
a second pad group including two second data I/O pads, a fifth power supply pad that commonly supplies the externally supplied second DC voltage to two second data I/O buffers connected respectively to the two second data I/O pads, and a sixth power supply pad that commonly supplies the externally supplied third DC voltage to the two second data I/O buffers, where the two second data I/O pads and the fourth to sixth power supply pads are arranged in a same row in one direction, wherein the first and second pad groups are sandwiched between the first and fourth power supply pads, the two second data I/O pads, the fifth power supply pad, and the sixth power supply pad included in the second pad group are arranged in order of one of the two second data I/O pads, the fifth power supply pad, other of the two second data I/O pads, and the sixth power supply pad viewed from the fourth power supply pad, and a first data strobe signal pad that receives an externally supplied first data strobe signal and a second data strobe signal pad that receives a second data strobe signal that is a complementary signal of the first data strobe signal are arranged between the third power supply pad and the sixth power supply pad.

15. The semiconductor device as claimed in claim 11, further comprising:

a fourth power supply pad that supplies an externally supplied fourth DC voltage to at least one of the memory cell array and the control circuit unit; and a second pad group including two second data I/O pads, a fifth power supply pad that commonly supplies the externally supplied second DC voltage to two second data I/O buffers connected respectively to the two second data I/O pads, and a sixth power supply pad that commonly supplies the externally supplied third DC voltage to the two second data I/O buffers, where the two second data I/O pads and the fourth to sixth power supply pads are arranged in a row in parallel to the row constituting the first power supply pad and the first pad group, wherein the two second data I/O pads, the fifth power supply pad, and the sixth power supply pad included in the second pad group are arranged in order of one of the two second data I/O pads, the fifth power supply pad, other of the two second data I/O pads, and the sixth power supply pad viewed from the fourth power supply pad.

16. A semiconductor device comprising:

a memory cell array;

a control circuit unit that controls a read operation and a write operation for the memory cell array;

a first power supply pad that supplies an externally supplied first DC voltage to at least one of the memory cell array and the control circuit unit;

a plurality of data I/O buffers connected to the control circuit unit;

a plurality of second power supply pads that respectively supply an externally supplied second DC voltage to corresponding ones of a plurality of data I/O buffers;

a plurality of third power supply pads that respectively supply an externally supplied third DC voltage to corresponding ones of the data I/O buffers; and a plurality of data I/O pads each connected to an associated one of the data I/O buffers, wherein the first power supply pad, one of the data I/O pads, one of the second power supply pads, another one of the data I/O pads, and one of the third power supply pads are arranged in order in a row without sandwiching other pad with an adjacent pad.

17. The semiconductor device as claimed in claim 16, wherein one of the data I/O buffers is arranged between one of the data I/O pads and one of the second power supply pads, and another one of the data I/O buffers is arranged between one of the second power supply pads and the another one of the data I/O pads.

* * * * *